US011087913B2

(12) United States Patent
Premerlani et al.

(10) Patent No.: US 11,087,913 B2
(45) Date of Patent: Aug. 10, 2021

(54) TRANSFORMER SYSTEM

(71) Applicant: General Electric Company, Schenectady, NY (US)

(72) Inventors: William James Premerlani, Scotia, NY (US); Omar Mendez Zamora, Nuevo Leon (MX); Enrique Betancourt Ramirez, Nuevo Leon (MX); Ibrahima Ndiaye, Niskayuna, NY (US); Ahmed Elasser, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 669 days.

(21) Appl. No.: 15/594,745

(22) Filed: May 15, 2017

(65) Prior Publication Data

US 2018/0330862 A1 Nov. 15, 2018

(51) Int. Cl.

*G01R 31/00* (2006.01)
*H01F 27/00* (2006.01)
*H01F 29/02* (2006.01)

(52) U.S. Cl.

CPC ......... *H01F 27/004* (2013.01); *H01F 29/025* (2013.01)

(58) Field of Classification Search

USPC ........................................... 324/547; 336/170
See application file for complete search history.

(56) References Cited

U.S. PATENT DOCUMENTS 4,060,783 A 11/1977 Harnden
5,015,922 A 5/1991 Muehling
5,023,766 A * 6/1991 Laidler .............. H02M 3/3376 323/902

(Continued)

FOREIGN PATENT DOCUMENTS

WO 0119459 A1 4/2000
WO 2015109551 A1 7/2015

OTHER PUBLICATIONS

Carrus et al., "Improving the Security of Sub Transmission Systems by Use of Temporary Insertion of Series and Shunt Reactance's", IEEE Bologna Power Tech Conference Proceedings, Jun. 23-26, 2003.

(Continued)

*Primary Examiner* — Vincent Q Nguyen
(74) *Attorney, Agent, or Firm* — Eversheds Sutherland (US) LLP

(57) ABSTRACT

A flexible transformer system includes conductive windings extending around a magnetic core of a transformer phase and impedance-varying windings extending around the magnetic core of the transformer phase. The conductive windings and the impedance-varying windings are configured to conduct electric current around the magnetic core of the transformer phase. The system includes an impedance switch coupled with the impedance-varying windings and with the conductive windings. The impedance switch is configured to change an impedance of the system by changing which impedance-varying winding of the impedance-varying windings is conductively coupled with the conductive windings and which impedance-varying winding of the impedance-varying windings is disconnected from the conductive windings.

19 Claims, 13 Drawing Sheets

(56) References Cited

U.S. PATENT DOCUMENTS

| | | | | |
|---|---|---|---|---|
| 7,612,237 | B2 * | 11/2009 | Knaup | C07C 231/12 549/553 |
| 7,835,128 | B2 | 11/2010 | Divan et al. | |
| 2013/0238267 | A1 | 9/2013 | Tziouvaras | |
| 2013/0300209 | A1 | 11/2013 | Long et al. | |
| 2014/0077913 | A1 * | 3/2014 | Weber | H01F 29/02 336/170 |
| 2017/0123006 | A1 * | 5/2017 | Radler | G01R 31/027 |

OTHER PUBLICATIONS

Fukumoto et al., "Feasible Method of Calculating Leakage Reactance of 9-Winding Transformer for High-Voltage Inverter System", International Power Electronics Conference (IPEC-Hiroshima-ECCE-Asia), May 18-21, 2014.

Fukumoto et al., "Calculating Leakage Reactance of 9-Winding Transformer Using Time-Dependent 3D FEM Analysis", 41st Annual Conference of the IEEE Industrial Electronics Society, IECON, Nov. 9-12, 2015.

* cited by examiner

TRANSFORMER SYSTEM

GOVERNMENT LICENSE RIGHTS

This invention was made with U.S. Government support under Contract Number DE-OE0000908 awarded by the United States Department of Energy. The Government has certain rights in the invention.

FIELD

The subject matter described herein relates to transformers.

BACKGROUND

Transformers, such as large power transformers, are used in electric power networks to transfer electric power between electromagnetically coupled circuits. While the high availability of transformers is important to prevent disturbances in the transmission of bulk electric power, the readiness for seamless deployment, for example in the case of an emergency or failure, can be important for grid resilience.

A high quality, properly designed large power transformer system with suitable protection and supervision relays is a reliable component of the electric power network. When an internal fault occurs, however, the transformer system can be severely damaged which can lead to a full replacement of the system. Even smaller amounts of damage can require the transformer system to be transported to a workshop for repair, leading to significant expenses. The limited number of manufacturers, the limited availability of raw materials (such as magnetic core materials), testing requirements, and special modes of transportation due to the large size and weight of transformers can significantly impact the mean time to repair (MTTR) or time to replace a damaged system.

Among the factors that can impede a quick replacement of a large power transformer, voltage ratio and short-circuit impedance incompatibility of existing spare transformers are two critical parameters. Therefore, a system improved with a variable voltage and/or impedance may be deployed more quickly relative to a conventional system, reduce the number of required spare units for power utilities, reduce the inventory costs, reduce the system recovery time in the event of a failure or damage, and may improve overall grid resilience.

BRIEF DESCRIPTION

In one embodiment, a flexible transformer system includes conductive windings extending around a magnetic core of a transformer phase and impedance-varying windings extending around the magnetic core of the transformer phase. The conductive windings and the impedance-varying windings are configured to conduct electric current around the magnetic core of the transformer phase. The system includes an impedance switch coupled with the impedance-varying windings and with the conductive windings. The impedance switch is configured to change an impedance of the system by changing which impedance-varying winding of the impedance-varying windings is conductively coupled with the conductive windings and which impedance-varying winding of the impedance-varying windings is disconnected from the conductive windings.

In one embodiment, a flexible transformer system includes conductive windings extending around a magnetic core of a transformer phase and impedance-varying windings extending around the magnetic core of the transformer phase. The conductive windings and the impedance-varying windings are configured to conduct electric current around the magnetic core of the transformer phase, wherein the impedance-varying windings are disposed at one or more of a high voltage bushing end of the transformer phase or at a low voltage bushing end of the transformer phase. The system includes an impedance switch coupled with the impedance-varying windings and with the conductive windings. The impedance switch is configured to change an impedance of the system by changing which impedance-varying winding of the impedance-varying windings is conductively coupled with the conductive windings and which impedance-varying winding of the impedance-varying windings is disconnected from the conductive windings.

In one embodiment, a method includes changing an impedance of a flexible transformer system that includes impedance-varying windings and conductive windings extending around a magnetic core of a transformer phase by actuating an impedance switch coupled with the impedance-varying windings and with the conductive windings in order to change which impedance-varying winding of the impedance-varying windings is conductively coupled with the conductive windings and which impedance-varying winding of the impedance-varying windings is disconnected from the conductive windings.

BRIEF DESCRIPTION OF THE DRAWINGS

The present inventive subject matter will be better understood from reading the following description of non-limiting embodiments, with reference to the attached drawings, wherein below.

DETAILED DESCRIPTION

Figure 1:
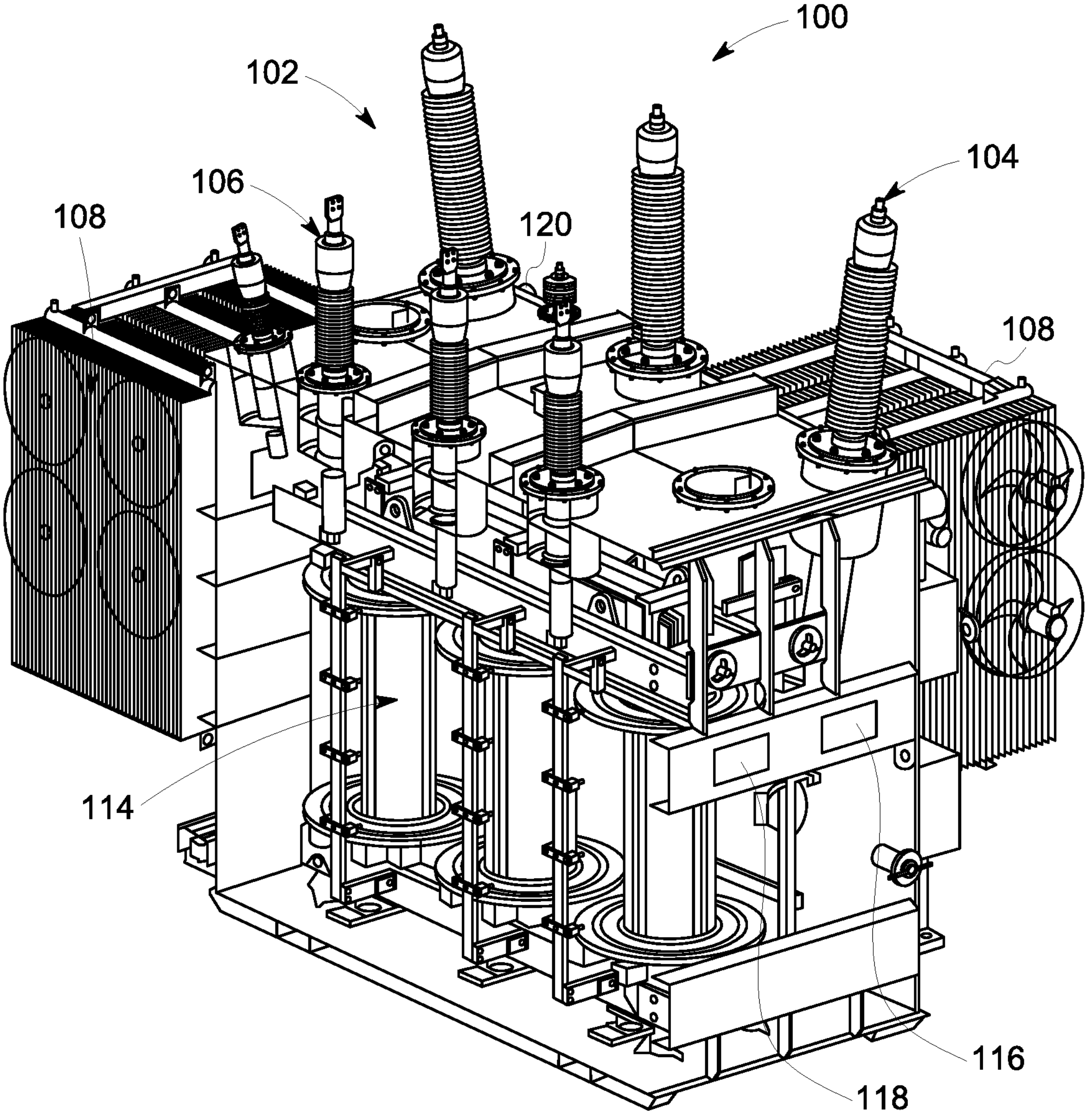
FIG. 1 illustrates a flexible transformer system in accordance with one embodiment.

One or more embodiments of the inventive subject matter described herein provide for flexible transformer systems and methods that are capable of accommodating multiple standard primary to secondary voltage ratios in an electric power grid as well as providing an adjustable short-circuit impedance to match that of a failed transformer to be replaced. One or more embodiments include tapped voltage-varying windings that enable selection of a transmission class voltage among multiple taps at the low voltage side with the actuation and adjustment of a voltage switch, implementation of a method for selecting the transformer leakage reactance without changing the voltage ratio with impedance-varying windings and the actuation of an impedance switch, and arranging and electrically connecting all conductive windings in order to minimize short-circuit forces and dielectric stresses.

One or more technical effects of the subject matter described herein contribute to the enhanced resiliency of existing electric power grid systems by allowing a fast replacement of damaged transformers. Flexibility attributes of the flexible transformer system depend not only on the ability to closely match the transformation voltages and partly or fully match the power rating of the systems to be replaced, but also on the ability to match the replaced transformer impedance to coordinate with system short circuit currents and power transfer stability requirements. Additionally, one or more technical effects of the subject matter described herein allow for replacement of flexible transformer systems to fit within existing substations with different voltages and physical layout, and have accessories (e.g., bushings, control cabinet, cooling, control and protection elements, or the like) capable of adapting to different substation control systems. By providing voltage and impedance flexibility, the systems and methods described herein reduce the need for multiple spares, thereby reducing inventory costs for utilities.

The system and methods described herein enable a single transformer design to operate in multiple locations, speeding the replacement process, and reducing the cost of the acquisition of a replacement transformer. One or more technical effects significantly reduces the financial impact on the energy sector by reducing the number of transformers needed to buy, store, and maintain. Large power transformers can be multi-million dollar assets that are not readily available and can require a significant amount of time to be manufactured, tested, transported, and installed. One or more technical effects of the flexible transformer system simplifies the replacement process of damaged systems by allowing the short circuit impedance of the transformer to be adjusted at the facility during maintenance or repair (e.g., after the transformer has been manufactured and delivered).

Additionally, one or more embodiments of the inventive subject matter described herein enable a decoupling selection of the voltage ratio and leakage reactance of the variable transformer system by having separate windings for the voltage ratio and the leakage reactance. For example, the tapped voltage-varying windings for the variable voltage-ratio are designed to provide the desired voltage-ratios with as little leakage reactance as possible. The tapped impedance-varying windings are designed to cover the desired range of leakage reactance values without impacting the voltage ratio. The voltage-ratio and the voltage-varying windings are selected for the desired voltage ratio of the system, and the leakage reactance tap is selected to produce the desired leakage reactance. Adjustment of the leakage reactance will not result in a non-standard set of available voltage taps.

FIG. 1 illustrates a flexible transformer system 100 in accordance with one embodiment. Optionally, the system 100 may be a large power transformer system. The system 100 includes three transformer phases 102 that are disposed within a system housing 120. One or more of the transformer phases 102 includes a high voltage bushing end 104 and a low voltage bushing end 106 that extend outside and away from the system housing 120. For example, the high voltage bushing end 104 may be capable of accommodating 230 kV, 345 kV, 500 kV, 765 kV, or the like. Additionally, the low voltage bushing end 106 may be capable of accommodating 69 kV, 115 kV, 138 kV, 161 kV, 230 kV, or the like. One or more cooling systems 108 operably coupled with the system 100 are configured to cool the temperature of the system 100. For example, the cooling system 108 may include fans, exhaust systems, coolant systems, or the like, configured to maintain a temperature of the system 100 within a designated temperature range.

Each of the transformer phases 102 are disposed inside of a housing 114 within the system housing 120. For example, conductive windings, electrical switches terminations, a magnetic core of each transformer phase 102, and the like, are disposed inside of the housing 114. In the illustrated embodiment, the transformer system 100 includes three transformer phases 102 that are contained within three housings 114. Optionally, the system 100 may include less than three or more than three transformer phases 102. The details of the components contained within the housing 114 will be discussed in more detail below with FIG. 2.

The system 100 includes an impedance switch 116 and a voltage switch 118 disposed on an exterior surface of the system housing 120. For example, the impedance switch 116 and the voltage switch 118 are positioned at a location that can be accessed by an operator of the system 100. The impedance switch 116 is electrically connected with one or more varying-impedance windings included in the transformer phases 102. For example, an operator may change an impedance of the transformer phase 102 and/or change the impedance of the system 100 by changing a setting of the impedance switch 116. The impedance switch 116 selectively couples impedance-varying windings with conductive windings of the transformer phase 102 without changing the voltage ratio of the transformer phase 102. For example, the impedance switch 116 electrically connects one or more impedance-varying windings with conductive windings of the phase 102. Additionally or alternatively, the impedance switch 116 may selectively couple impedance-varying windings with voltage-varying windings without changing the voltage ratio of the transformer phase 102. In the illustrated embodiment, the system 100 includes a common impedance switch 116 that may be used to change the impedance of the system 100. Additionally or alternatively, the system 100 may include an impedance switch 116 for each transformer phase 102 of the system 100. For example, FIG. 1 illustrates the system 100 having three transformer phases 102. The system 100 may include three impedance switches 116 electrically connected to the impedance-varying windings and the conductive windings of the three transformer phases 102.

The voltage switch 118 is electrically connected with one or more varying voltage windings of the transformer phases 102. For example, an operator may change the voltage ratio of the transformer phase 102 and/or change the voltage ratio of the system 100 by changing a setting of the voltage switch 118. The voltage switch 118 selectively couples voltage-varying windings with conductive windings of the transformer phase 102 without changing the impedance of the transformer phase 102. For example, the voltage switch 118 electrically connects one or more voltage-varying windings with conductive windings of the phase 102. Additionally or alternatively, the voltage switch 118 may selectively couple voltage-varying windings with impedance-varying windings without changing the impedance of the transformer phase 102. In the illustrated embodiment, the system 100 includes a common voltage switch 118 that may be used to change the voltage ratio of the system 100. Additionally or alternatively, the system 100 may include a voltage switch 118 for each transformer phase 102 of the system 100. For example, FIG. 1 illustrates the system 100 having three transformer phases 102. The system 100 may include three voltage switches 118 electrically connected to the voltage-varying windings and the conductive windings of the three transformer phases 102.

The impedance switch 116 selectively couples impedance-varying windings with conductive windings and/or with voltage-varying windings of the transformer phase 102 by coupling a first segment of impedance-varying windings with the conductive windings. Subsequently, the impedance switch 116 may then selectively couple a second, different segment of impedance-varying windings with the conductive windings. Further subsequently, the impedance switch 116 may then selectively couple a third, a fourth, a fifth, or the like, different segment of impedance-varying windings with the conductive windings. For example, by selectively coupling a first segment of impedance-varying windings with the conductive windings of the transformer phase 102, the impedance switch 116 may decouple the second, third, fourth, and/or fifth segments of impedance-varying windings from the conductive windings of the transformer phase 102.

In one or more embodiments, the system 100 is a flexible three-phase large power autotransformer intended for transmission class applications having a power capacity ranging between and including 300 Megavolt Amperes (MVA) to 600 MVA. Optionally, the system 100 may be a single-phase large power autotransformer system having a power capacity less than 300 MVA and/or greater than 600 MVA. In one or more embodiments, the system 100 is capable of accommodating three standard voltage ratios with a fixed high-side voltage rate at 345 kV and three configurable taps at the low-side for operation at 115 kV, 138 kV, or 161 kV. Optionally, the system may have a flexible or fixed high-side voltage rate, a flexible or fixed low-side voltage rate, or any combination thereof. For example, the system 100 may be capable of accommodating one or more voltage ratios including 345 kV/161 kV, 345 kV/138 kV, 345 kV/115 kV, 345 kV/69 kV, 230 kV/161 kV, 230 kV/138 kV, 230 kV/115 kV, 230 kV/69 kV, 500 kV/230 kV, 500 kV/161 kV, 500 kV/138 kV, 500 kV/115 kV, or 500 kV/69 kV. In one or more embodiments, the flexible transformer system 100 has an impedance that is adjustable within the range of 4%-12% based on a self-cooled power rating of the transformer. Optionally, the transformer system 100 may have an adjustable impedance less than 4% and/or greater than 12% based on the self-cooled power rating of the transformer. The variable voltage and the variable impedance of the system 100 are discussed in more detail below.

In one or more embodiments, the system 100 may be identified as an autotransformer for use in transmission class applications. Optionally, the system 100 may be designed for conventional transformers having separate primary and secondary windings. In one or more embodiments, the system 100 is intended to be used in conventional substations. Optionally, the system 100 may be designed to be used for mobile substations.

Figure 2:
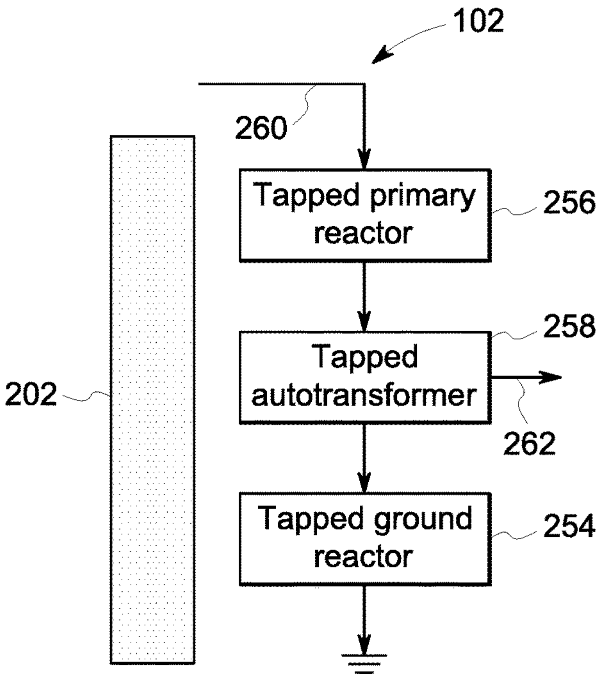
FIG. 2 illustrates a schematic representation of a transformer one-phase winding in accordance with one embodiment.

FIG. 2 illustrates a schematic representation of one of the three transformer phases 102 shown in FIG. 1 in accordance with one embodiment. Each of the transformer phases 102 has a tapped primary reactor 256 located near the high voltage bushing end 104, a tapped autotransformer 258, and a tapped ground reactor 254 located near the low voltage bushing end 106 relative to the tapped primary reactor 256. The tapped primary reactor 256 has multiple segments of impedance-varying windings and the tapped ground reactor 254 has multiple segments of impedance-varying windings that extend around a common magnetic core 202. Optionally, the transformer phase 102 may include either the tapped primary reactor 256 or the tapped ground reactor 254. The tapped autotransformer 258 has conductive windings that also extend around the common magnetic core 202. For example, the tapped autotransformer 258 may be designed for minimum reactance, and the tapped ground and primary reactors 254, 256 may be designed to be integrated with the tapped autotransformer 258 to provide a range of additional reactance values up to a designated threshold. The primary and ground impedance-varying windings are described in more detail below with FIG. 3.

The magnetic core 202 provides electromagnetic coupling for the tapped autotransformer 258 but does not provide electromagnetic coupling for the tapped primary reactor 256 or the tapped ground reactor 258. For example, the magnetic core 202 provides only mechanical mounting for the impedance-varying windings of the tapped primary and tapped ground reactors 256, 254.

The transformer phase 102 has a primary conductor 260 and a secondary conductor 262. The primary conductor 260 is electrically connected with the high voltage bushing end 104 of FIG. 1. For example, the primary conductor 260 electrically connects the high voltage bushing end 104 with the tapped primary reactor 256 of the transformer phase 102. The secondary conductor 262 is tapped from the tapped autotransformer 258 and is coupled with one or more voltage-varying windings of the transformer phase 102. For example, the tapped secondary conductor 262 electrically connects the voltage-varying windings with the tapped autotransformer 258 in order to provide the desired voltage ratio of the transformer phase 102 with minimal leakage reactance. The voltage-varying windings are described in more detail below.

Figure 3:
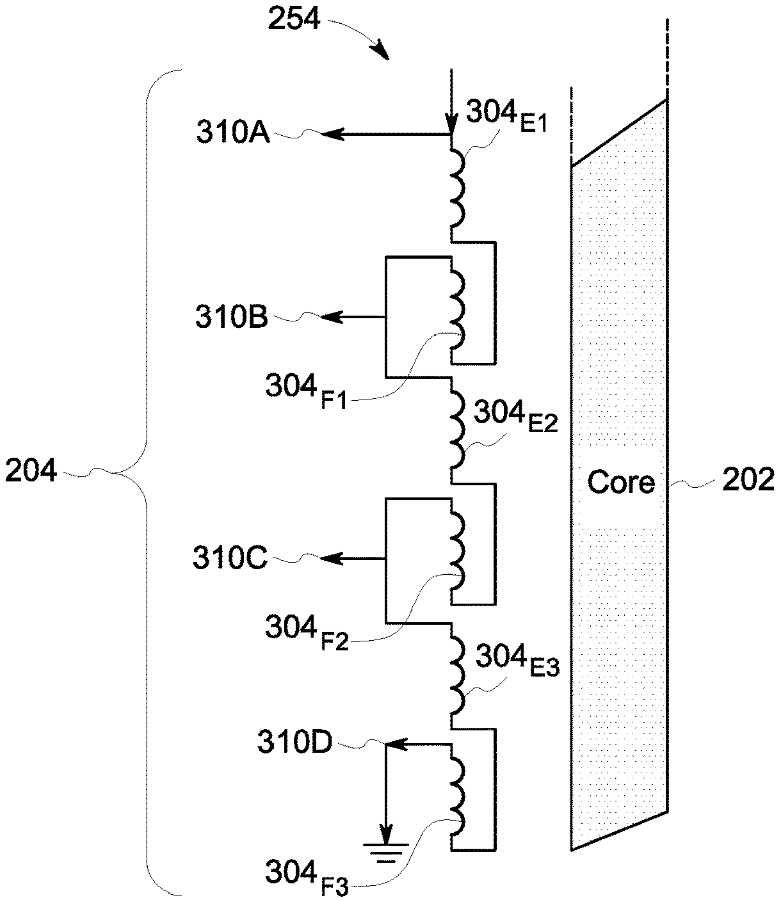
FIG. 3 illustrates a schematic representation of ground side impedance-varying windings in accordance with one embodiment.

FIG. 3 illustrates a schematic illustration of ground impedance-varying windings 204 of the tapped ground reactor 254 in accordance with one embodiment. The configuration of the ground impedance-varying windings 204 are similar to a configuration of the primary impedance-varying windings. The tapped ground reactor 254 has multiple segments of impedance-varying windings 204. The ground impedance-varying windings 204 extend around the magnetic core 202 of the transformer phase 102. In the illustrated embodiment, the tapped ground reactor 254 has six segments of impedance-varying windings 204 (e.g., six coils) and four taps 310A-D. Alternatively, the tapped ground reactor 254 may have more than six or less than six segments of windings and/or more than four or less than four taps. The impedance-varying windings 204 and the taps 310A-D provide a range of leakage reactance values of the system 100. For example, the taps 310 and the impedance-varying windings 204 enable the impedance of the transformer phase 102 to change within a range from 4%-12% by changing a setting of the impedance switch 116 (of FIG. 1). The method of changing the impedance of the transformer phase 102 will be discussed in more detail below.

The ground impedance-varying windings 204 have positive and negative polarity relative to other conductive windings that extend around the magnetic core 202. For example, the six-ground impedance-varying windings 204 are separated into even windings 304E and odd windings 304F. The tapped ground reactor 254 has the same number of even windings 304E and odd windings 304F. The odd windings 304F and the even windings 304E are electrically equivalent and are connected in a way in order to produce opposite magnetic fluxes. For example, the net magnetic flux out of one pair of even windings 304E and odd windings 304F is approximately zero allowing the impedance-varying windings 204 to be magnetically decoupled from the voltage-varying windings. For example, by having the same number of even windings 304E as odd windings 304F, the magnetic coupling between the ground impedance-varying windings 204 and the magnetic core 202 is approximately zero.

The taps 310 are positioned such that the even windings 304E and odd windings 304F may be operationally selected in pairs. For example, by changing the reactor tap by changing a setting of the impedance switch 116 (e.g., changing the impedance of the transformer phase 102), the overall voltage between the tapped ground reactor 254 and the overall transformer phase 102 is substantially unchanged. Additionally or alternatively, electrical coupling between the tapped primary reactor 256 and/or the tapped ground reactor 254 and the leakage reactance of the transformer phase 102 is substantially zero. Therefore, the voltages between the taps 310 during a fault on the terminals of the transformer phase 102 are minimal.

Figure 4:
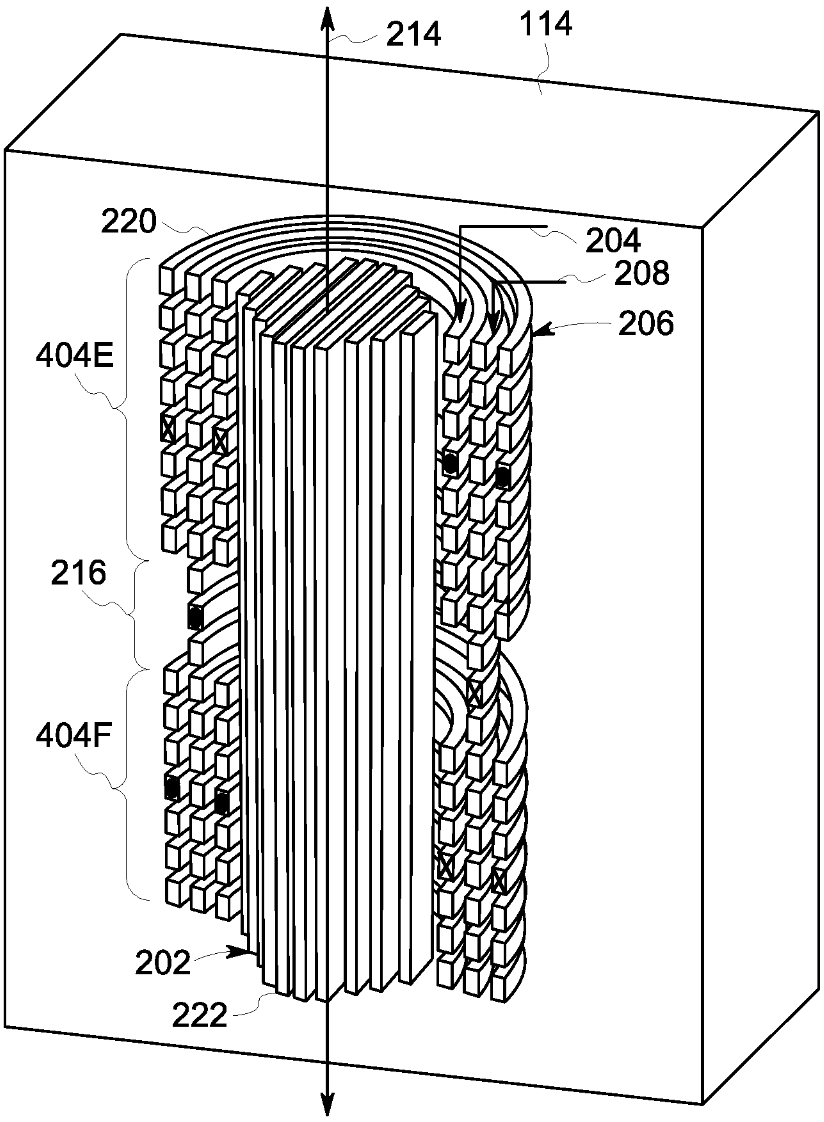
FIG. 4 illustrates a cross-sectional perspective view of integrated impedance-varying windings with conductive windings of a transformer in accordance with one embodiment.

FIG. 4 illustrates a cross-sectional perspective view of integrating impedance-varying windings with conductive windings of one of the three transformer phases 102 of FIG. 1. Conductive windings 208 of the tapped autotransformer 258 (of FIG. 2) extend around the magnetic core 202 of the transformer phase 102. For example, the conductive windings 208 may be primary or main voltage windings of the system 100. Optionally, the conductive windings 208 may carry alternative electric power through the system 100. The magnetic core 202 has a generally circular cross-sectional shape and is generally cylindrical and elongated along an axis 214 between a first end 220 and a second end 222. Alternatively, the magnetic core 202 may have another cross-sectional shape. The magnetic core 202 is manufactured of a magnetic material having a high magnetic permeability that is used to guide magnetic fields in electrical, electromechanical, and magnetic devices. The magnetic core 202 provides electromagnetic coupling for the transformer phase 102 with the additional phases 102 of the system 100. The conductive windings 208 extend around the magnetic core between the first end 220 and the second end 222 in order to transform the magnetic flux generated by the magnetic core 202 of the transformer phase 102 into voltage and electric current.

The transformer phase 102 also includes the ground impedance-varying windings 204 of the tapped ground reactor 254 and primary impedance-varying windings 206 of the tapped primary reactor 256 that are mechanically wrapped around the magnetic core 202. The impedance-varying windings of the tapped ground reactor and the tapped primary reactor are configured to adjust a short-circuit impedance of the transformer phase 102 between different available impedance values. Adjusting the short-circuit impedance of the transformer phase 102 will be discussed in more detail below.

The ground impedance-varying windings 204 extend around the magnetic core 202 between the magnetic core 202 and the conductive windings 208. The primary impedance-varying windings 206 extend around the magnetic core 202 outside of the conductive windings 208. For example, the primary impedance-varying windings 206 are distal to the magnetic core 202 relative to the ground impedance-varying windings 204. In the illustrated embodiment, the transformer phase 102 includes the impedance-varying windings of the tapped ground reactor 254 and the primary reactor 256. Optionally, the transformer phase 102 may include either the ground impedance-varying windings 204 or the primary impedance-varying windings 206.

The impedance-varying windings 204, 206 include a number of even windings 404E and the same number of odd windings 404F (corresponding to the even 304E and odd windings 304F of FIG. 3). The even windings 404E extend around the magnetic core 202 at the first end 220 of the magnetic core 202, and the odd windings 404F extend around the magnetic core 202 at the opposite, second end 222 of the magnetic core 202. For example, the even windings 404E may be wrapped in a first polarity (e.g., positive), and the odd windings 404F may be wrapped in an opposite, second polarity (e.g., negative) to the even windings 404E. The even windings 404E and the odd windings 404F are separated by a gap 216 along the axis 214 of the magnetic core 202. At the gap 216, the conductive windings 208 of the transformer 102 are exposed. For example, the conductive windings 208, positioned between a layer of the ground impedance-varying windings 204 and the primary impedance-varying windings 206, are visible within the gap 216 and are not visible outside of the gap 216 along the axis 214 of the magnetic core 202.

By positioning the even windings 404E at the first end 220 and the odd windings 404F at the second end 222, the resulting magnetic coupling between the magnetic core 202 and the impedance-varying windings 204, 206 is essentially zero. For example, the symmetry of the same number of even windings 404E and odd windings 404F at opposite ends of the magnetic core 202 electrically decouples the impedance-varying windings 204, 206 from the conductive windings 208 of the transformer phase 102. Positioning the even windings 404E at the first end 220 and the odd windings 404F at the second end 222 of the magnetic core 202 increases the amount of reactance that can be obtained for a given number of winding turns relative to the even windings 404E not being separated from the odd windings 404F by the gap 216. Additionally, positioning the even windings 404E at the first end 220 and the odd windings 404F at the second end 222 allows the transformer phase 102 to achieve a net magnetic flux of substantially zero while the even windings 404E and the odd windings 404F enable the same amount of magnetic flux with opposite signs (e.g., positive and negative). Optionally, one or more of the ground impedance-varying windings 204, the primary impedance-varying windings 206, the even windings 404E or the odd windings 404F may be positioned in an alternative arrangement. For example, the even and odd windings 404E, 404F may be arranged in an alternating pattern. Alternatively, the windings 204, 206, 404E, 404F may be arranged in any other arrangement. For example, an alternative configuration of the impedance-varying windings 204, 206 and the conductive windings 208 will be discussed in FIGS. 5A and 5B.

Figure 5A:
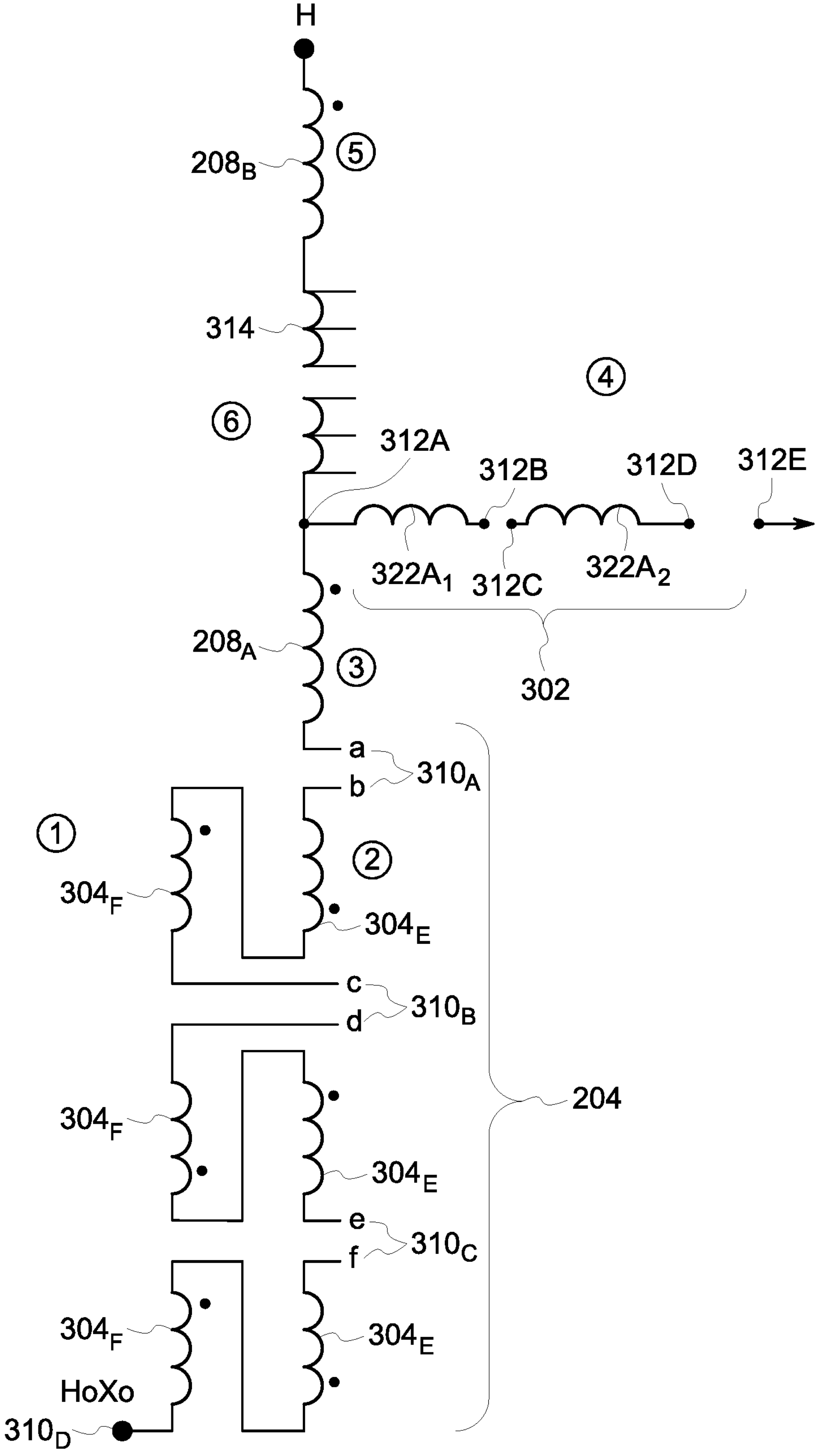
FIG. 5A illustrates a schematic representation of the circuitry of integrated impedance-varying windings with conductive windings of a transformer in accordance with one embodiment.
Figure 5B:
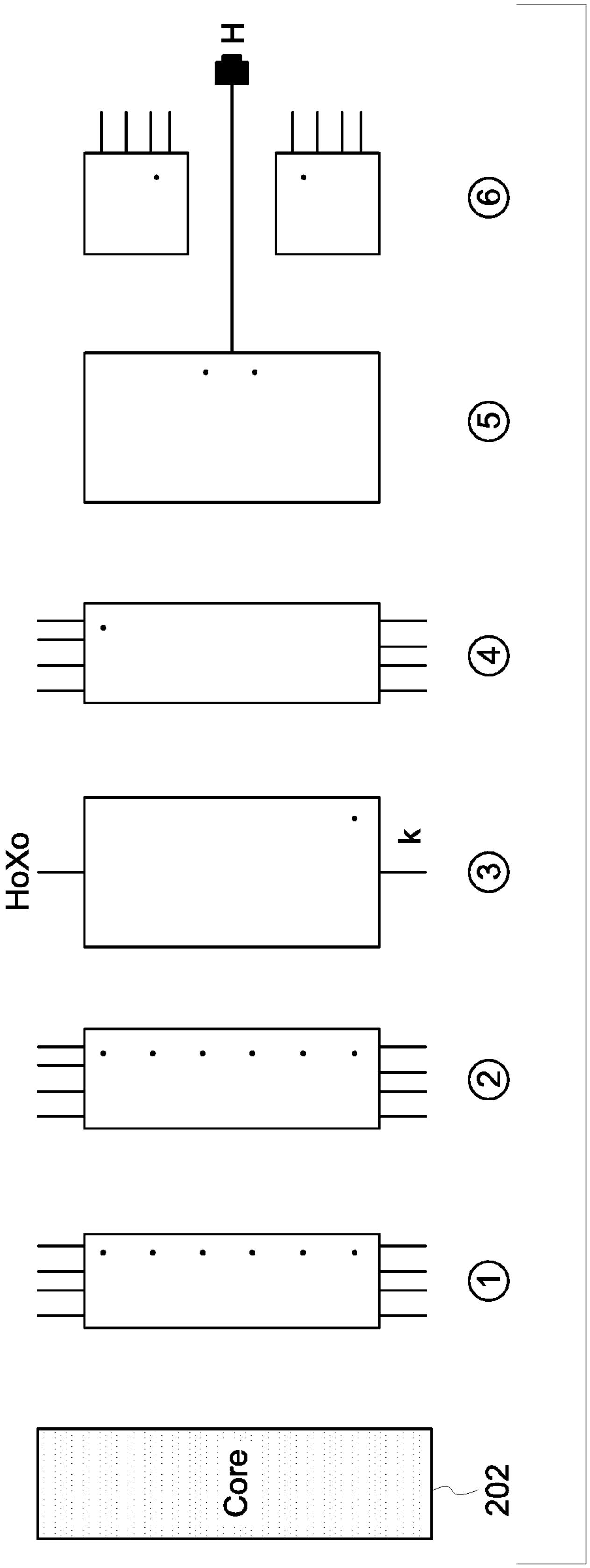
FIG. 5B illustrates a layout of the circuitry schematic illustration of FIG. 5A in accordance with one embodiment.

FIG. 5A illustrates a schematic representation of the circuitry for integrating impedance-varying windings with conductive windings of a transformer phase 102 in accordance with one embodiment. FIG. 5B illustrates a layout of the circuitry schematic of FIG. 5A. For example, FIG. 5B illustrates one example of a set of coaxial, cylindrical windings to illustrate the relative location of the windings to the magnetic core 202 of the transformer phase 102. FIGS. 5A and 5B will be discussed in detail together.

Winding 3 in FIG. 5A illustrates the conductive windings 208A of the tapped autotransformer 258. The conductive windings 208A include the turns necessary to provide a lower secondary voltage output of the transformer phase 102 relative to the conductive windings 208A including more turns than necessary. Winding 1 is an auxiliary positive turn, multiturn coil that contributes to flexible high to/from low impedance of the system 100. For example, Winding 1 illustrates the impedance-varying odd windings 304F of the transformer phase 102 short circuit impedance. Winding 2 is an auxiliary negative turn, multiturn coil that contributes to the flexible high to/from low impedance of the system 100. For example, Winding 2 illustrates the impedance-varying even windings 304E of the transformer phase 102 short circuit impedance. Winding 2 operates in combination with the Winding 1 to produce a net-zero effective turns. For example, the magnetic coupling out of Winding 1 and Winding 2 (e.g., the odd 304F and even 304E windings of the ground impedance-varying windings 204) is substantially zero. The impedance-varying windings 204 are made of multiple segments of windings (e.g., coils) such that the impedance-varying windings 204 are separated into pairs of odd and even windings 304F,304E.

In the illustrated embodiment of FIG. 5A, the taps 310A-D are shown as open circuits. Alternatively, in operation one or more of "a-b", "c-d", "e-f", or a combination thereof are connected representing taps 310A, 310B, 310C, respectively. The operator of the system 100 can change the impedance of the system 100 by changing a setting of the impedance switch 116 (of FIG. 1) to connect the HoXo bushing internal end (e.g., tap 310D) to any of the taps 310A-C. For example, by connecting tap 310D to tap 310A, the smallest transformer impedance value is obtained relative to connecting the tap 310D to either taps 310B or 310C. Additionally, by connecting tap 310D to tap 310C, the largest transformer impedance value is obtained relative to connecting the tap 310D to either taps 310A or 310B. The impedance switch 116 coupled with the impedance-varying windings 204 changes which impedance-varying winding of the impedance-varying windings is conductively coupled with the conductive windings, and which impedance-varying windings are disconnected from the conductive windings. For example, the impedance switch 116 changes the impedance of the system 100 by changing the portion of the impedance-varying windings that are connected to the conductive windings, and the portion of the impedance-varying windings that are decoupled from the conductive windings.

Figure 6A:
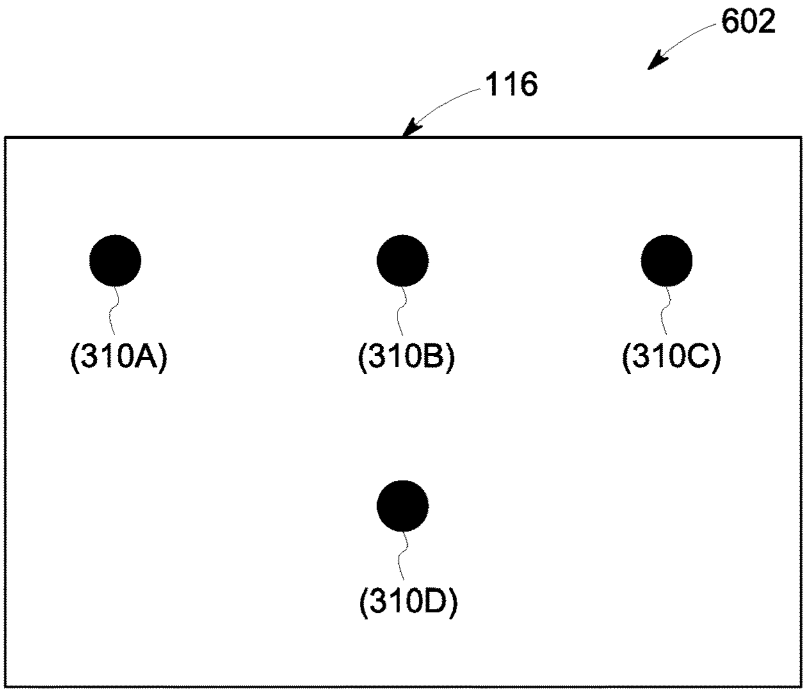
FIG. 6A illustrates an impedance tap selection switch of the system set to a first setting in accordance with one embodiment.
Figure 6B:
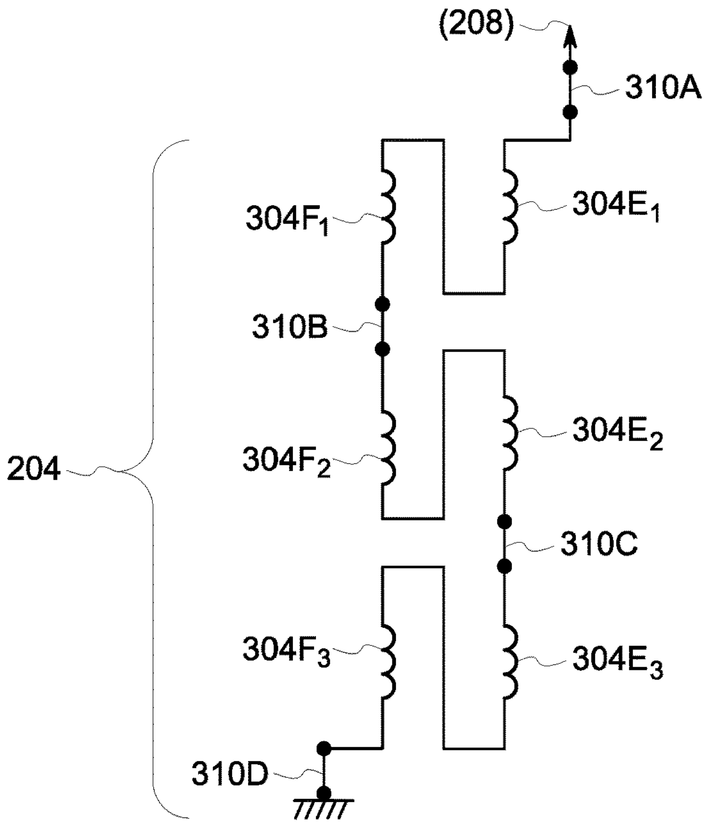
FIG. 6B illustrates a schematic representation of the circuitry of impedance-varying windings based on the first setting of the impedance switch of FIG. 6A in accordance with one embodiment.

FIG. 6A illustrates the impedance switch 116 of the transformer phase 102 set to a first setting 602. FIG. 6B illustrates a schematic representation of the circuitry of the impedance-varying windings 204 based on the first setting 602 of the impedance switch 116 of FIG. 6A in accordance with one embodiment. The first setting 602 of the impedance switch 116 illustrates the transformer phase 102 having a maximum impedance by leaving all segments of the impedance-varying windings electrically coupled to the circuitry of the transformer phase 102. For example, the first setting 602 closes a switch at each of the four taps 310A-D in order for all segments of the impedance-varying windings 204 to form a closed circuit between the taps 310A-D.

Figure 7A:
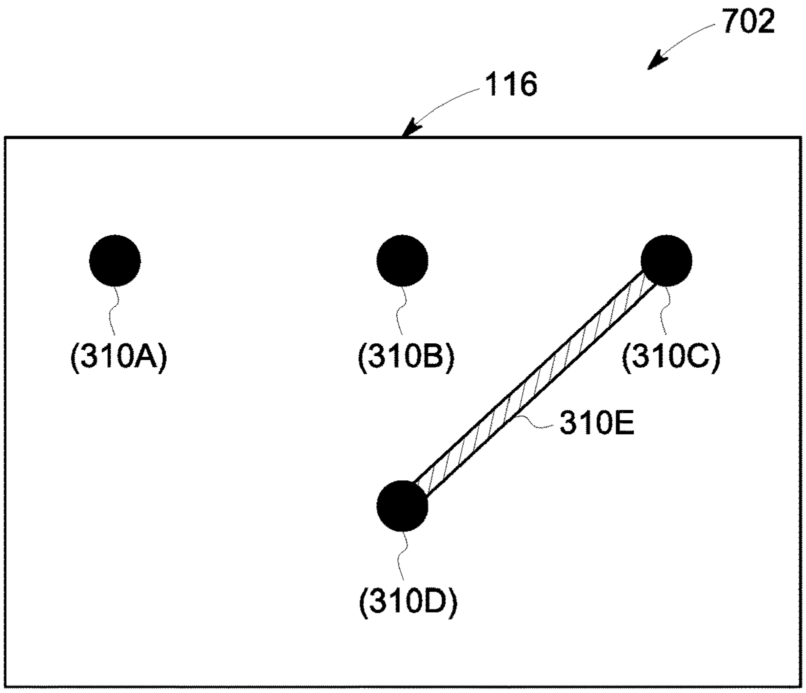
FIG. 7A illustrates an impedance tap selection switch of the system set to a second setting in accordance with one embodiment
Figure 7B:
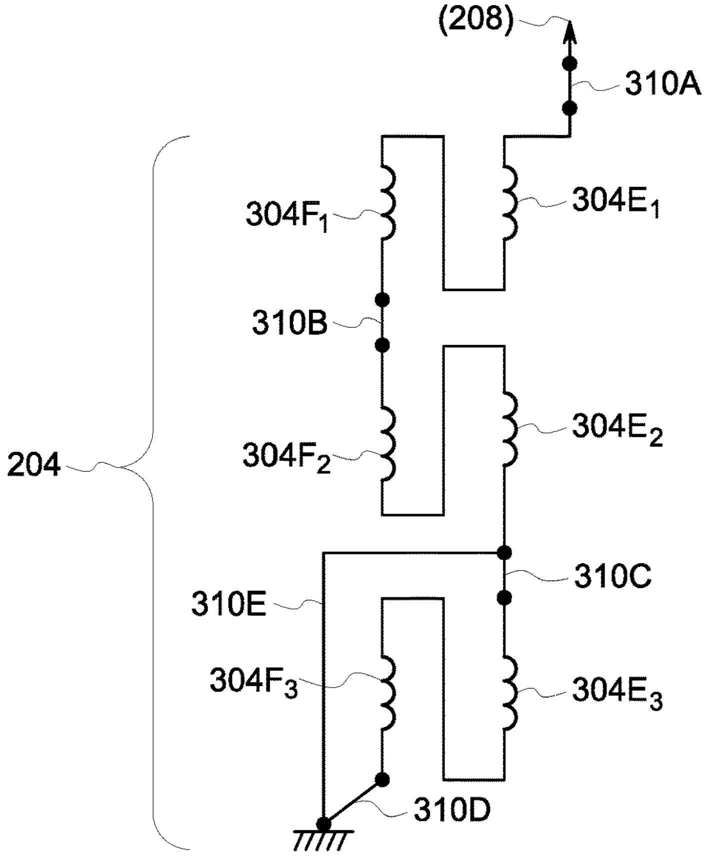
FIG. 7B illustrates a schematic representation of the circuitry of impedance-varying windings based on the second setting of the impedance switch of FIG. 7A in accordance with one embodiment.

FIG. 7A illustrates the impedance switch 116 of the transformer phase 102 set to a second setting 702. FIG. 7B illustrates a schematic representation of the circuitry of the impedance-varying windings 204 based on the second setting 702 of the impedance switch 116 of FIG. 7A in accordance with one embodiment. The second setting 702 of the switch 116 illustrates the transformer phase 102 having an impedance that is less than the impedance of the first setting 602 of FIGS. 6A and 6B by electrically coupling a portion of the impedance-varying windings 204 (e.g., the windings 304E1, 304F1, 304E2, and 304F2) to the circuitry of the transformer phase 102. For example, the second setting 702 connects the tap 310D to the tap 310C with a connection bar 310E.

Figure 8A:
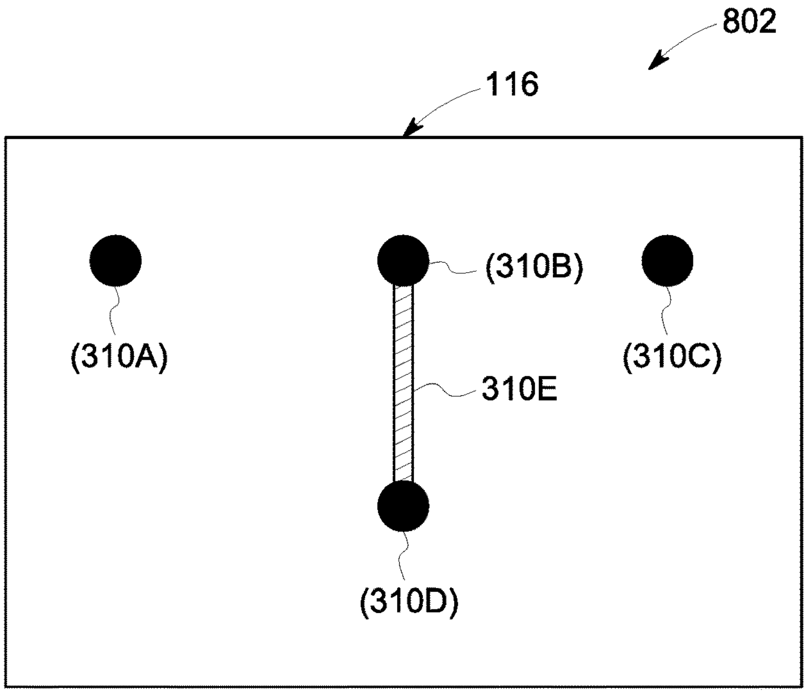
FIG. 8A illustrates an impedance tap selection switch of the system set to a third setting in accordance with one embodiment.
Figure 8B:
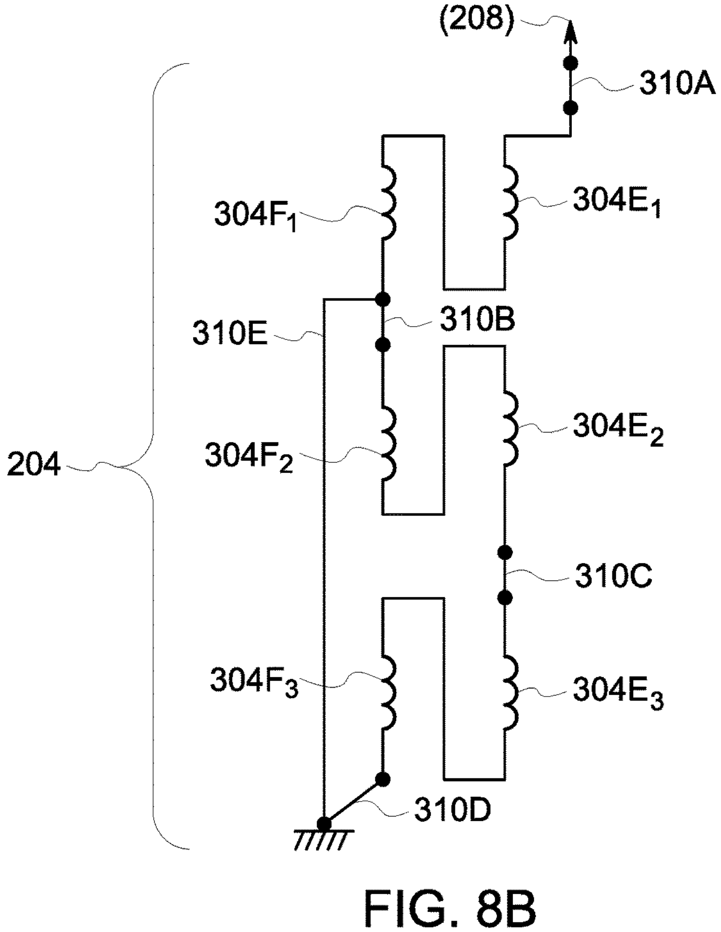
FIG. 8B illustrates a schematic representation of the circuitry of impedance-varying windings based on the third setting of the impedance switch of FIG. 8A in accordance with one embodiment.

FIG. 8A illustrates the impedance switch 116 of the transformer phase 102 set to a third setting 802. FIG. 8B illustrates a schematic representation of the circuitry of the impedance-varying windings 204 based on the third setting 802 of the impedance switch 116 of FIG. 8A in accordance with one embodiment. The third setting 802 of the switch 116 illustrates the transformer phase 102 having an impedance that is less than the impedance of the second setting 702 of FIGS. 7A, 7B, and having an impedance that is less than the impedance of the first setting 602 of FIGS. 6A, 6B. The third setting 802 electrically couples a portion of the impedance-varying windings 204 (e.g., the windings 304E1 and 304F1) to the circuitry of the transformer phase 102. For example, the third setting 802 connects the tap 310D to the tap 310B with the connection bar 310E.

Figure 9A:
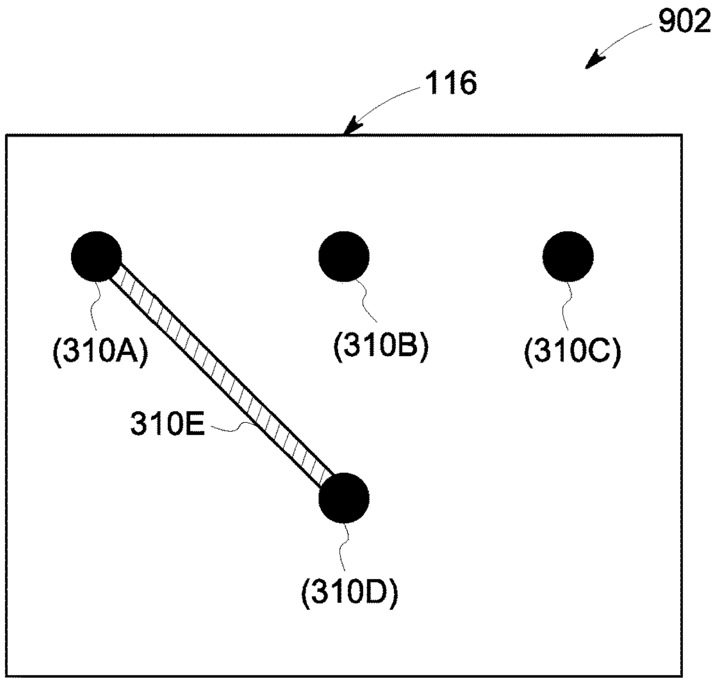
FIG. 9A illustrates an impedance tap selection switch of the system set to a fourth setting in accordance with one embodiment.
Figure 9B:
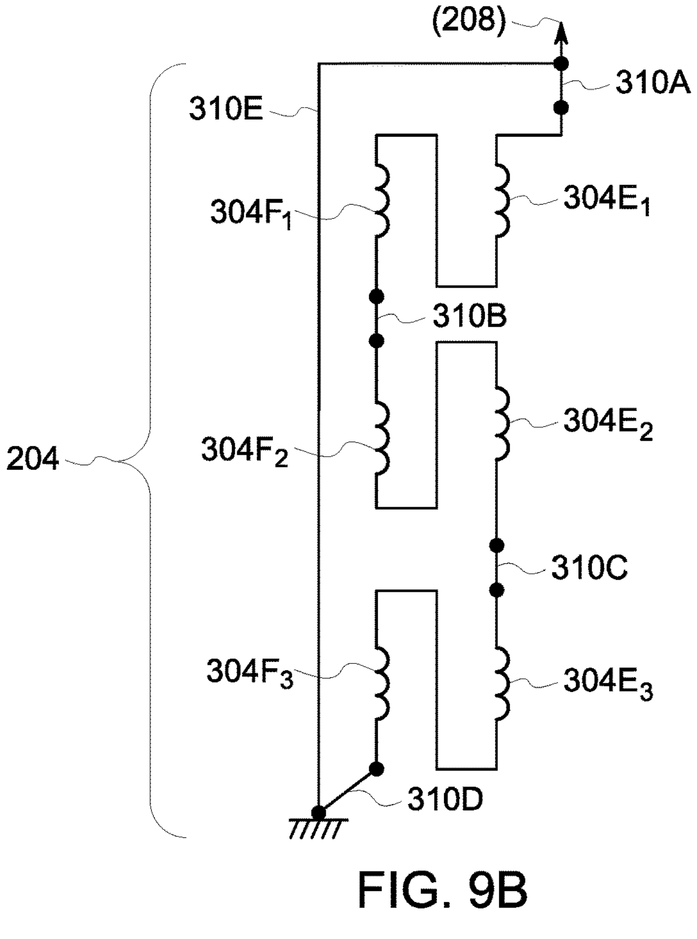
FIG. 9B illustrates a schematic representation of the circuitry of impedance-varying windings based on the fourth setting of the impedance switch of FIG. 9A in accordance with one embodiment.

FIG. 9A illustrates the impedance switch 116 of the transformer phase 102 set to a fourth setting 902. FIG. 9B illustrates a schematic representation of the circuitry of the impedance-varying windings 204 based on the fourth setting 902 of the impedance switch 116 of FIG. 9A in accordance with one embodiment. The fourth setting 902 of the switch 116 illustrates the transformer phase 102 having an impedance that is less than the impedance of the third setting 802, that is less than the impedance of the second setting 702, and that is less than the impedance of the first setting 602. For example, the fourth setting 902 of the impedance switch 116 illustrates the transformer phase 102 having a minimum impedance by electrically disconnecting all segments of the impedance-varying windings 204 from the circuitry of the transformer phase 102. For example, the fourth setting 902 connects the tap 310D to the tap 310A with the connection bar 310E.

FIGS. 6A, 6B, 7A, 7B, 8A, 8B, 9A, and 9B illustrate four examples of the variable transformer system 100 having six impedance-varying coils and four taps in order to change an impedance of the system 100. Optionally, the system 100 may have less than or more than 6 coils and/or less than or more than 4 taps in order to change the impedance of the transformer system 100.

Returning to FIGS. 5A and 5B, Winding 4 illustrates a two-circuit multiturn coil that provides the voltage-varying windings 302 of the transformer phase 102. For example, the voltage switch 118 (of FIG. 1) is configured to change the voltage ratio (e.g., the voltage output) of the system 100 by changing which voltage-varying winding of the voltage-varying windings 302 is conductively coupled with the conductive windings 208A and which voltage-varying winding of the voltage-varying windings 302 is disconnected from the conductive windings 208A. The voltage-varying windings 302 include taps 312A-E. The operator of the system 100 can change the voltage ratio of the system 100 by changing a setting of the voltage switch 118 (of FIG. 1) to connect any of the taps 310A-E to any other taps 310A-E in order to connect the voltage-varying windings 302 in series, in parallel, in any opposite polarity, or the like. The voltage switch 118 coupled with the voltage-varying windings 302 changes which voltage-varying winding of the voltage-varying windings is conductively coupled with the conductive windings, and which voltage-varying windings are disconnected from the conductive windings. For example, the voltage switch 118 changes the voltage ratio of the system 100 by changing the portion of the voltage-varying windings that are connected to the conductive windings, and the portion of the voltage-varying windings that are decoupled from the conductive windings.

Figure 10A:
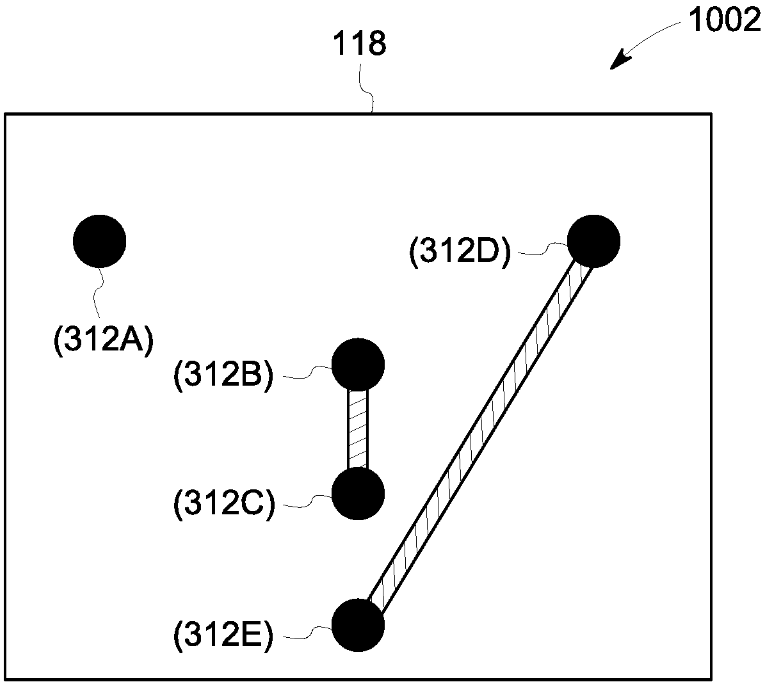
FIG. 10A illustrates a voltage tap selection switch of the system set to a first setting in accordance with one embodiment.
Figure 10B:
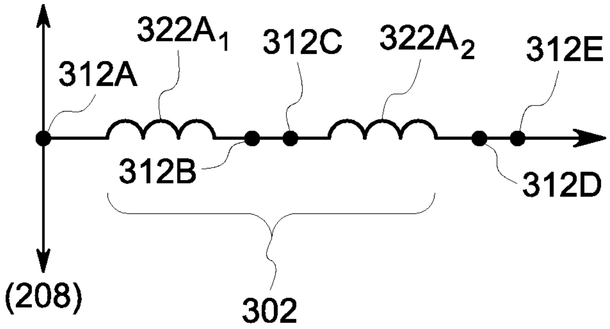
FIG. 10B illustrates a schematic representation of the circuitry of voltage-varying windings based on the first setting of the voltage switch of FIG. 10A in accordance with one embodiment.

FIG. 10A illustrates the voltage switch 118 of the transformer phase 102 set to a first setting 1002. FIG. 10B illustrates a schematic representation of the circuitry of the voltage-varying windings 302 based on the first setting 1002 of the voltage switch 118 of FIG. 10A in accordance with one embodiment. The first setting 1002 of the switch 118 conductively couples the voltage-varying windings 322A1, 322A2 with the conductive windings 208A of the transformer 102. For example, the first setting 1002 of the voltage switch 118 couples the voltage-varying windings 322A1 and 322A2 in series and the remaining voltage-varying windings in series with the conductive windings 208A. The first setting 1002 of the voltage switch 118 illustrates the system 100 having the largest voltage ratio output (e.g., the smallest voltage ratio) with the series insertion of all of the voltage-varying windings 302 to the conductive windings 208A.

Figure 11A:
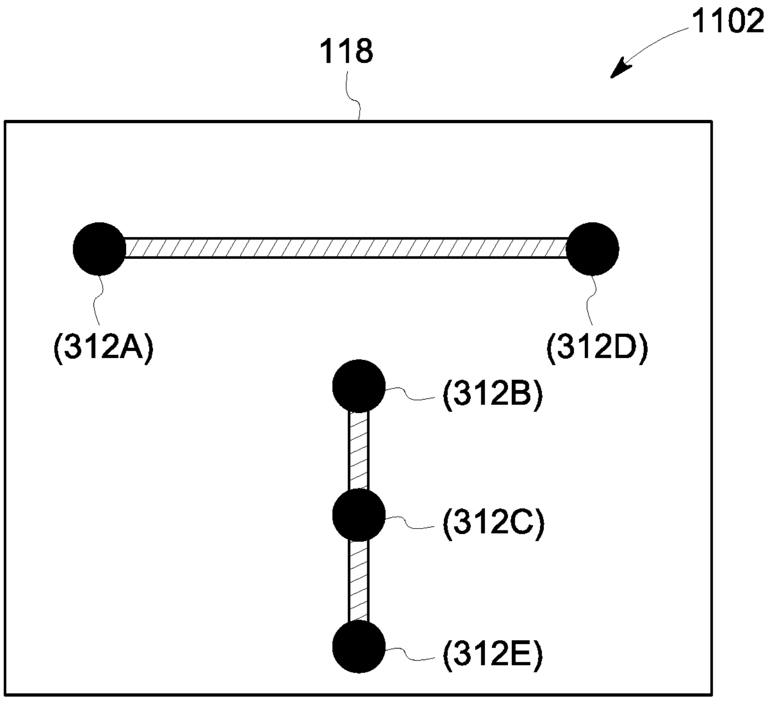
FIG. 11A illustrates a voltage tap selection switch of the system set to a second setting in accordance with one embodiment.
Figure 11B:
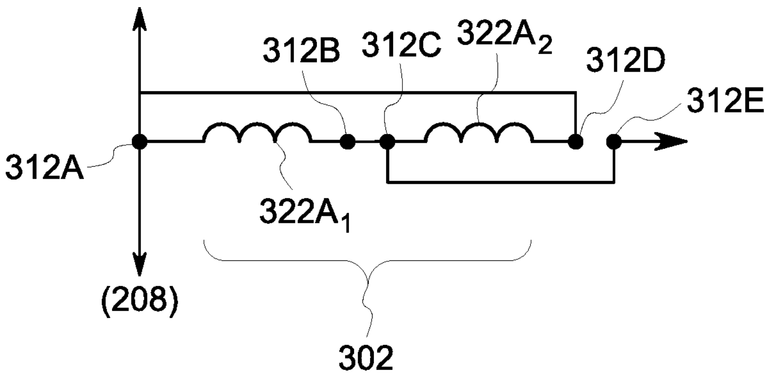
FIG. 11B illustrates a schematic representation of the circuitry of voltage-varying windings based on the second setting of the voltage switch of FIG. 11A in accordance with one embodiment.

FIG. 11A illustrates the voltage switch 118 of the transformer phase 102 set to a second setting 1102. FIG. 11B illustrates a schematic representation of the circuitry of the voltage-varying windings 302 based on the second setting 1102 of the voltage switch 118 of FIG. 11A in accordance with one embodiment. The second setting 1102 of the voltage switch 118 conductively couples the voltage-varying windings 322A1 and 322A2 together with the conductive windings 208A of the transformer phase 102. Additionally, the second setting 1102 couples the voltage-varying windings 322A1 and 322A2 in opposite directions relative to each other. For example, the windings 322A1 are set as "positive" windings and the windings 322A2 are set as "negative" windings. The second setting 1102 enables the voltage-varying windings 322A1 and 322A2 to be coupled with the conductive windings 208A of the transformer phase 102 while adding an effective "zero turns" in the circuitry of transformer phase 102. The second setting 1102 of the voltage switch 118 couples the voltage-varying windings 322A1 and 322A2 in series and the remaining voltage-varying windings in series with the conductive windings 208A. For example, the second setting 1102 connects the tap 312D to the tap 312A, and connects the tap 312E to the tap 312C. The second setting 1102 of the voltage switch 118 illustrates the transformer phase 102 having a voltage ratio that is greater than the voltage ratio of the first setting 1002 of the transformer 102 phase of FIGS. 10A and 10B. For example, the second setting 1102 of the voltage switch 118 illustrates the transformer phase 102 having a higher voltage ratio relative to the first setting 1002 with a net 'zero turns' added to the conductive windings 208A.

Figure 12A:
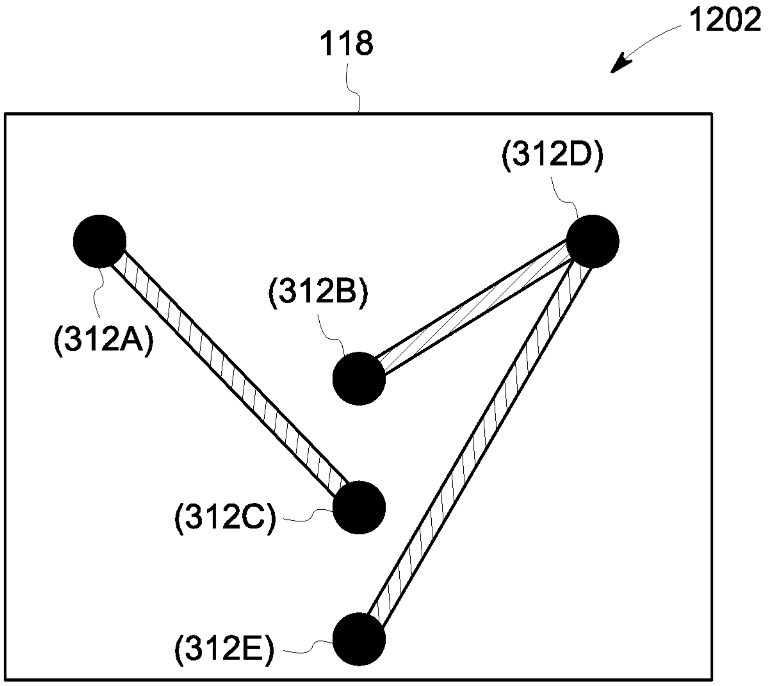
FIG. 12A illustrates a voltage tap selection switch of the system set to a third setting in accordance with one embodiment.
Figure 12B:
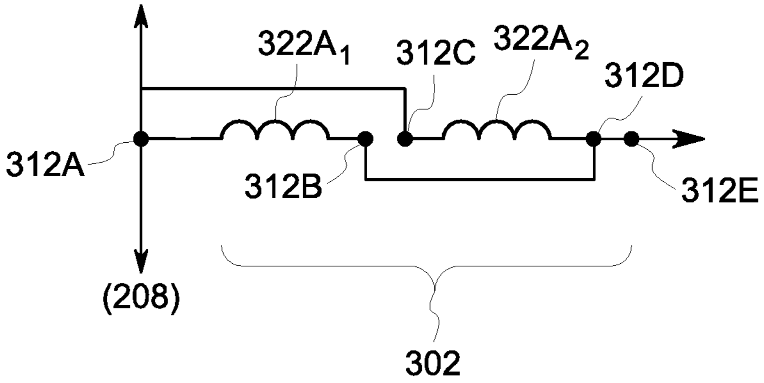
FIG. 12B illustrates a schematic representation of the circuitry of voltage-varying windings based on the third setting of the voltage switch of FIG. 12A in accordance with one embodiment.

FIG. 12A illustrates the voltage switch 118 of the transformer phase 102 set to a third setting 1202. FIG. 12B illustrates a schematic representation of the circuitry of the voltage-varying windings 302 based on the third setting 1202 of the voltage switch 118 of FIG. 12A in accordance with one embodiment. The third setting 1202 of the voltage switch 118 couples the voltage-varying windings 322A1 and 322A2 together with the conductive windings 208A. For example, the third setting 1202 couples the voltage-varying windings 322A1 and 322A2 in the same direction relative to each other such that the windings 322A1 and 322A2 have the same polarity. The third setting 1202 of the voltage switch 118 couples the voltage-varying windings 322A1 and 322A2 in parallel and the remaining voltage-varying windings in series with the conductive windings 208A. For example, the third setting 1202 connects the tap 312D to the tap 312B, and connects the tap 312C to the tap 312A. The third setting 1202 of the voltage switch 118 illustrates the transformer phase 102 having a voltage ratio that is less than the voltage ratio of the second setting 1102, and that is greater than the voltage ratio of the first setting 1002.

FIGS. 10A, 10B, 11A, 11B, 12A, and 12B illustrate three examples of the flexible transformer system 100 having three voltage-varying coils and five taps in order to change a voltage ratio of the system 100. Optionally, the system 100 may have less than or more than three coils and/or less than or more than five taps in order to change the voltage-ratio of the system 100.

Returning to FIGS. 5A and 5B, Winding 5 illustrates a center-entry conductive windings 208B of the transformer phase 102. For example, the center-entry conductive windings 208B are electrically coupled with the high voltage bushing end 104 of the system 100. Winding 6 illustrates a disk-type conductive winding 314. The disk-type conductive windings 314 provide +/−2×2.5% off-circuit taps for the high-voltage circuit side of the transformer phase 102.

Optionally, the circuit of the transformer phase 102 may not include the disk-type conductive windings 314. Additionally or alternatively, the disk-type conductive windings 314 may be integrated as part of a series winding of the circuit of the transformer phase 102.

Figure 13:
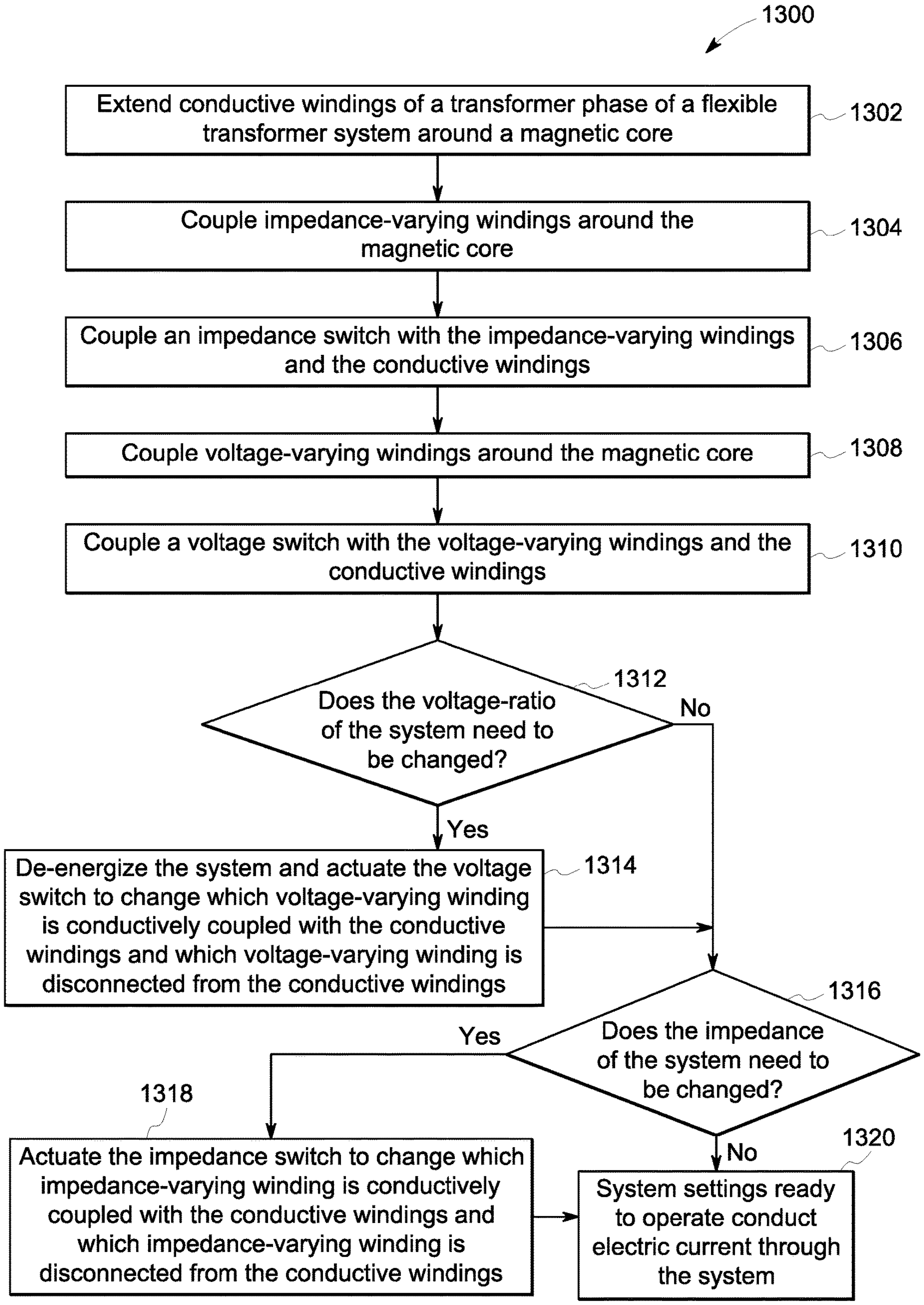
FIG. 13 illustrates a method flowchart in accordance with one embodiment.

FIG. 13 illustrates a method flowchart 1300 of a flexible transformer system 100 operating to select the impedance and/or the operating voltage class of the system 100. For example, the system 100 may be a flexible large power transformer system, a flexible three-phase system, a flexible single-phase system, or the like. Optionally, the system 100 may be a single-phase flexible mobile power transformer system, a multi-phase flexible mobile power transformer system, or the like, when the system is used as a mobile transformer within mobile substations.

At 1302, conductive windings (e.g., conductive windings 208) are extended around a magnetic core (e.g., the magnetic core 202) of a transformer phase (e.g., transformer phase 102) of the variable transformer system 100. The conductive windings 208 are electrically coupled with a high voltage bushing end 104 and a low voltage bushing end 106 of the transformer phase 102.

At 1304, impedance-varying windings (e.g., the ground impedance-varying windings 204) are coupled around the magnetic core 202. For example, the conductive windings 208 and the impedance-varying windings 204 are wrapped around and are magnetically coupled with the magnetic core 202 within a common housing 114 of the transformer phase 102. The impedance-varying windings 204 include a number of even windings (e.g., even windings 304E) and the same number of odd windings (e.g., odd windings 304F).

At 1306, an impedance switch is electrically coupled with the impedance-varying windings 204 and the conductive windings 208 of the transformer phase 102. For example, the impedance switch 116, electrically coupled with the impedance-varying windings 204 and the conductive windings 208, may be used to electrically connect one or more of the impedance-varying windings 302 to the conductive windings 208. The impedance switch 116 is disposed on an exterior surface of a system housing 120 in order to be actuated by an operator of the system 100 when the operator is near-by, standing close to, within reach of, or the like, of the system 100. In one or more embodiments, the system may be a three-phase transformer system 100 and each transformer phase (e.g., each transformer phase 102) will have an impedance switch. Optionally, a single impedance switch may be common to the three transformer phases. The common impedance switch of the three transformer phases and/or the individual impedance switches for each transformer phase operates simultaneously when the system 100 is not energized in order to keep the leakage impedance of the three transformer phases substantially the same. Optionally, at 1306, dedicated impedance switches with on-load tap chargers may be provided in order to adjust the impedance of the transformer phase 102 while the system 100 is energized to dynamically support grid operations versus minimal unbalance of load or transmission line impedance. Dynamic impedance switches (e.g., on-load tap chargers) may operate independently for each transformer phase 102. Optionally, one or more dynamic impedance switches may operate dependently to one or more additional impedance switch for each phase 102.

At 1308, voltage-varying windings (e.g., the voltage-varying windings 302) are coupled around the magnetic core 202. For example, conductive windings 208, the impedance-varying windings 204, and the voltage-varying windings 302 are wrapped around and are magnetically coupled with the magnetic core 202 within the common housing 114 of the transformer phase 102. At 1310, a voltage switch is electrically coupled with the voltage-varying windings 302 and the conductive windings 208 of the transformer phase 102. For example, the voltage switch 118, electrically coupled with the voltage-varying windings 302 and the conductive windings 208, may be used to electrically connect one or more of the voltage-varying windings 302 to the conductive windings 208. The voltage switch 118 is disposed on an exterior surface of a system housing 120 in order to be actuated by an operator of the system 100. In one or more embodiments, the system may be a three-phase transformer system 100 and each transformer phase (e.g., each transformer phase 102) will have a voltage switch. Optionally, a single voltage switch may be common to the three transformer phases. The voltage switch 118 and the impedance switch 116 may be disposed on the same exterior surface or on different exterior surfaces of the system housing 120.

At 1312, a decision is made if the voltage-ratio of the system 100 needs to be changed. For example, the voltage-varying windings 302 may provide a range of voltages at either a high-side voltage, low-side voltage, or a combination thereof, that can change the voltage-ratio of the system 100. For example, the system 100 may have a voltage-ratio of 345 kV/115 kV, but may need to be changed to a 345 kV/138 kV voltage-ratio in order for the system 100 to be used at a different substation, located to a different transmission line, or the like. If the voltage-ratio of the system 100 needs to be changed, flow of the method proceeds towards 1314. Alternatively, if the voltage-ratio of the system 100 does not need to be changed (e.g., the voltage-ratio can remain unchanged), then flow of the method proceeds towards 1316.

At 1314, the system 100 is de-energized and the voltage switch 118 is actuated to change the coupling of the voltage-varying windings with the conductive windings 208. For example, actuating the voltage switch 118 changes which voltage-varying winding is conductively coupled with the conductive windings 208 and which voltage-varying winding is disconnected from the conductive windings 208. For example, the actuation of a common voltage switch 118 of the system 100 may couple windings 322A1 and 322A2 in series, in parallel, or in opposite polarity, and then the voltage switch 118 may couple the voltage-varying windings with the conductive windings 208 in order to change the voltage class of a low-voltage side of the transformer 102 and to change the voltage ratio of the system 100. Additionally, each voltage switch 118 corresponding to each transformer phase 102 may be actuated and changed to the same setting in order to change the voltage ratio of the system 100. The voltage switch 118 may be actuated manually by an operator of the system 100, autonomously by the system 100, or by any alternative method. After the voltage-ratio of the system 100 has changed, flow of the method proceeds towards 1316.

At 1316, a decision is made if the leakage impedance of the transformer system 100 needs to be changed. For example, the impedance-varying windings 204 may provide a range of leakage reactance values. The transformer system 100 may need to have a leakage reactance value that is greater than the leakage reactance of the conductive windings 208 (e.g., a minimum leakage reactance). For example, the transformer system 100 may need to increase the reactance of the system by conductively coupling one or more of the impedance-varying windings 204 with the conductive windings 208. If the impedance of the transformer system

100 needs to be changed, flow of the method proceeds towards 1318. Alternatively, if the impedance of the system 100 does not need to be changed (e.g., the impedance can remain unchanged), then flow of the method proceeds towards 1320.

At 1318, the impedance switch 116 is actuated to change which impedance-varying windings are conductively coupled with the conductive windings 208, and which impedance-varying windings are decoupled from the conductive windings 208. For example, actuation of a common impedance switch 116 of the system 100 may connect the tap 310D to either of the taps 310A-C of each transformer phase 102 in order to add one or more pairs of even and odd windings 304E, 304F in series with the conductive windings 208 in order to increase or decrease the leakage impedance of the system 100. Additionally, each impedance switch 116 corresponding to each transformer phase 102 of the system 100 may be actuated and changed to the same setting in order to change the leakage impedance of the system 100. The impedance switch 116 may be actuated manually by an operator of the system 100, autonomously by the system 100, or by any alternative method. After the impedance of the transformer phase 102 has changed, flow of the method proceeds towards 1320.

At 1320, the settings of the transformer system 100 (e.g., including the setting of each transformer phase 102) is complete. The system 100 and each transformer phase 102 operates with a leakage reactance and voltage-ratio at which the impedance switch 116 and the voltage switch 118 have been set to. For example, the transformer phase 102 may operate with a leakage reactance of 10% and a voltage-ratio of 345 kV/138 kV based on the settings of the impedance switch 116 and the voltage switch 118.

Optionally, in one or more embodiments, the system 100 includes at least one transformer phase 102 for a single-phase transformer system 100 having high voltage bushings, low voltage bushings, cooling systems, a tank including insulating materials (e.g., oil, paper, or the like), an impedance switch, a voltage switch, additional instrumentation and/or protection relays, and the like. Optionally, in one or more embodiments, the system 100 includes three transformer phases 102 for a three-phase transformer system 100 having high voltage bushings, low voltage bushings, cooling systems, a tank including insulating materials (e.g., oil, paper, or the like), a common impedance switch or individual impedance switches for each phase, a common voltage switch or individual voltage switches for each phase, additional instrumentation and/or protection relays, and the like.

In one embodiment of the subject matter described herein, a flexible transformer system includes conductive windings extending around a magnetic core of a transformer phase and impedance-varying windings extending around the magnetic core of the transformer phase. The conductive windings and the impedance-varying windings are configured to conduct electric current around the magnetic core of the transformer phase. The system includes an impedance switch coupled with the impedance-varying windings and with the conductive windings. The impedance switch is configured to change an impedance of the system by changing which impedance-varying winding of the impedance-varying windings is conductively coupled with the conductive windings and which impedance-varying winding of the impedance-varying windings is disconnected from the conductive windings.

Optionally, the conductive windings and the impedance-varying windings are disposed in a common housing of the transformer phase.

Optionally, the system includes voltage-varying windings extending around the magnetic core of the transformer phase. The voltage-varying windings also configured to conduct electric current around the magnetic core of the transformer phase. The system includes a voltage switch coupled with the voltage-varying windings and with the conductive windings. The voltage switch is configured to change a voltage ratio of the system by changing which voltage-varying winding of the voltage-varying windings is conductively coupled with the conductive windings and which voltage-varying winding of the voltage-varying windings is disconnected from the conductive windings.

Optionally, the voltage-varying windings are disposed at one or more of a high voltage bushing end of the transformer phase or at a low voltage bushing end of the transformer phase.

Optionally, the voltage switch is configured to selectively couple the voltage-varying winding with the conductive windings without changing the impedance of the system.

Optionally, the impedance-varying windings further comprise a number of even windings and a same number of odd windings.

Optionally, the even windings of the impedance-varying windings are disposed at a first end of the magnetic core and the odd windings of the impedance-varying windings are disposed at an opposite, second end of the magnetic core.

Optionally, the impedance switch is configured to selectively couple the impedance-varying winding with the conductive windings without changing a voltage ratio of the system.

Optionally, the system is a flexible three-phase large power transformer.

Optionally, the impedance-varying windings are disposed at one or more of a high voltage bushing end of the transformer phase or at a low voltage bushing end of the transformer phase.

In one embodiment of the subject matter described herein, a flexible transformer system includes conductive windings extending around a magnetic core of a transformer phase and impedance-varying windings extending around the magnetic core of the transformer phase. The conductive windings and the impedance-varying windings are configured to conduct electric current around the magnetic core of the transformer phase, wherein the impedance-varying windings are disposed at one or more of a high voltage bushing end of the transformer phase or at a low voltage bushing end of the transformer phase. The system includes an impedance switch coupled with the impedance-varying windings and with the conductive windings. The impedance switch is configured to change an impedance of the system by changing which impedance-varying winding of the impedance-varying windings is conductively coupled with the conductive windings and which impedance-varying winding of the impedance-varying windings is disconnected from the conductive windings.

Optionally, the system includes voltage-varying windings extending around the magnetic core of the transformer phase. The voltage-varying windings also configured to conduct electric current around the magnetic core of the transformer phase. The system includes a voltage switch coupled with the voltage-varying windings and with the conductive windings. The voltage switch configured to change a voltage ratio of the system by changing which voltage-varying winding of the voltage-varying windings is conductively coupled with the conductive windings and which voltage-varying winding of the voltage-varying windings is disconnected from the conductive windings.

Optionally, the voltage switch is configured to selectively couple the voltage-varying winding with the conductive windings without changing the impedance of the system.

Optionally, the impedance-varying windings further include a number of even windings and a same number of odd windings.

Optionally, the impedance switch is configured to selectively coupled the impedance-varying winding with the conductive windings without changing a voltage ratio of the system.

In one embodiment of the subject matter described herein, a method includes changing an impedance of a flexible transformer system that includes impedance-varying windings and conductive windings extending around a magnetic core of a transformer phase by actuating an impedance switch coupled with the impedance-varying windings and with the conductive windings in order to change which impedance-varying winding of the impedance-varying windings is conductively coupled with the conductive windings and which impedance-varying winding of the impedance-varying windings is disconnected from the conductive windings.

Optionally, the method includes changing a voltage ratio of the system by actuating a voltage switch coupled with voltage-varying windings and the conductive windings to change which voltage-varying winding of the voltage-varying windings is conductively coupled with the conductive windings and which voltage-varying winding of the voltage-varying windings is disconnected from the conductive windings.

Optionally, changing the voltage ratio includes selectively coupling the voltage-varying winding with the conductive windings with the voltage switch without changing the impedance of the system.

Optionally, changing the impedance of the system includes selectively coupling the impedance-varying winding with the conductive windings with the impedance switch without changing a voltage ratio of the system.

As used herein, an element or step recited in the singular and proceeded with the word "a" or "an" should be understood as not excluding plural of said elements or steps, unless such exclusion is explicitly stated. Furthermore, references to "one embodiment" of the presently described inventive subject matter are not intended to be interpreted as excluding the existence of additional embodiments that also incorporate the recited features. Moreover, unless explicitly stated to the contrary, embodiments "comprising," "including," or "having" (or like terms) an element, which has a particular property or a plurality of elements with a particular property, may include additional such elements that do not have the particular property.

As used herein, terms such as "system" or "controller" may include hardware and/or software that operate(s) to perform one or more functions. For example, a system or controller may include a computer processor or other logic-based device that performs operations based on instructions stored on a tangible and non-transitory computer readable storage medium, such as a computer memory. Alternatively, a system or controller may include a hard-wired device that performs operations based on hard-wired logic of the device. The systems and controllers shown in the figures may represent the hardware that operates based on software or hardwired instructions, the software that directs hardware to perform the operations, or a combination thereof.

As used herein, terms such as "operably connected," "operatively connected," "operably coupled," "operatively coupled" and the like indicate that two or more components are connected in a manner that enables or allows at least one of the components to carry out a designated function. For example, when two or more components are operably connected, one or more connections (electrical and/or wireless connections) may exist that allow the components to communicate with each other, that allow one component to control another component, that allow each component to control the other component, and/or that enable at least one of the components to operate in a designated manner.

It is to be understood that the subject matter described herein is not limited in its application to the details of construction and the arrangement of elements set forth in the description herein or illustrated in the drawings hereof. The subject matter described herein is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the presently described subject matter without departing from its scope. While the dimensions, types of materials and coatings described herein are intended to define the parameters of the disclosed subject matter, they are by no means limiting and are exemplary embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the inventive subject matter, and also to enable one of ordinary skill in the art to practice the embodiments of inventive subject matter, including making and using any devices or systems and performing any incorporated methods. The patentable scope of the inventive subject matter is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A flexible transformer system comprising: conductive windings extending around a magnetic core of a transformer phase impedance-varying windings extending around the magnetic core of the transformer phase, the conductive windings and the impedance-varying windings configured to conduct electric current around the magnetic core of the transformer phase; and an impedance switch coupled with the impedance-varying windings and with the conductive windings, the impedance switch configured to change an impedance of the system by changing which impedance-varying winding of the impedance-varying windings is conductively coupled with the conductive windings and which impedance-varying winding of the impedance-varying windings is disconnected from the conductive windings; wherein the voltage-varying windings extending, around the magnetic core of the transformer phase, the voltage-varying windings also configured to conduct electric current around the magnetic core of the transformer phase: and a voltage switch coupled with the voltage-varying windings and with the conductive windings, the voltage switch configured to change a voltage ratio at the system by changing which voltage-varying winding of the voltage-varying windings is conductively coupled with the conductive windings and which voltage-varying winding of the voltage-varying windings is disconnected from the conductive windings.

2. The system of claim 1, wherein the conductive windings and the impedance-varying windings are disposed in a common housing of the transformer phase.

3. The system of claim 1, wherein the voltage-varying windings are disposed at one or more of a high voltage bushing end of the transformer phase or at a low voltage bushing end of the transformer phase.

4. The system of claim 1, wherein the voltage switch is configured to selectively couple the voltage-varying winding with the conductive windings without changing the impedance of the system.

5. The system of claim 1, wherein the impedance-varying windings further comprise a number of even windings and a same number of odd windings.

6. The system of claim 5, wherein the even windings of the impedance-varying windings are disposed at a first end of the magnetic core and the odd windings of the impedance-varying windings are disposed at an opposite, second end of the magnetic core.

7. The system of claim 1, wherein the impedance switch is configured to selectively couple the impedance-varying winding with the conductive windings without changing a voltage ratio of the system.

8. The system of claim 1, wherein the system is a flexible three-phase large power transformer.

9. The system of claim 1, wherein the impedance-varying windings are disposed at one or more of a high voltage bushing end of the transformer phase or at a low voltage bushing. end of the transformer phase.

10. A flexible transformer system comprising:

conductive windings extending around a magnetic core of a transformer phase;

impedance-varying windings extending around the >magnetic core of the transformer phase, the conductive windings and the impedance-varying windings configured to, conduct electric current around the magnetic core of the transformer phase, wherein the impedance-varying windings are disposed at one or more of a high voltage bushing end of the transformer phase or at a low voltage bushing end of the transformer phase; and an impedance switch coupled with the impedance-varying windings and with the conductive windings, the impedance switch configured to change an impedance of the system by changing which impedance-varying winding of the impedance-varying windings is conductively coupled with the conductive windings and which impedance-varying winding of the impedance-varying windings is disconnected from the conductive windings.

11. The system of claim 10, further comprising:

voltage-varying windings extending around the magnetic core of the transformer phase, the voltage-varying windings also configured to conduct electric current around the magnetic core of the transformer phase; and a voltage switch coupled with the voltage-varying windings and with the conductive windings, the voltage switch configured to change a voltage ratio of the system by changing which voltage-varying winding of the voltage-varying windings is conductively coupled with the conductive windings and which voltage-varying winding of the voltage-varying windings is disconnected from the conductive windings.

12. The system of claim 11, wherein the voltage switch is configured to selectively couple the voltage-varying winding with the conductive windings without changing the impedance of the system.

13. The system of claim 10, wherein the impedance-varying windings further comprise a number of even windings and a same number of odd windings.

14. The system of claim 10, wherein the impedance switch is configured to selectively couple the impedance-varying winding with the conductive windings without changing a voltage ratio of the system.

15. A method comprising:

changing an impedance of a flexible transformer system that includes impedance-varying, windings and conductive windings extending around a magnetic core of a transformer phase by actuating an impedance switch coupled with the impedance-varying windings and with the conductive windings in order to change which impedance-varying winding of the impedance-varying windings is conductively coupled with the conductive windings and which impedance-varying winding of the impedance-varying windings is disconnected from the conductive windings.

16. The method of claim 15, wherein coupling the impedance-varying windings around the magnetic core includes positioning the impedance-varying windings in a housing of the transformer phase that also includes the conductive windings.

17. The method of claim 15, further comprising:

changing a voltage ratio of the system by actuating a voltage switch coupled with voltage-varying windings and the conductive windings to change which voltage-varying winding of the voltage-varying windings is conductively coupled with the conductive windings and which voltage-varying winding of the voltage-varying windings is disconnected from the conductive windings.

18. The method of claim 17, wherein changing the voltage ratio of the system includes selectively coupling the voltage-varying winding with the conductive windings with the voltage switch without changing the impedance of the system.

19. The method of claim 15, wherein changing the impedance of the system includes selectively coupling the impedance-varying winding with the conductive windings with the impedance switch without changing a voltage ratio of the system.

* * * * *